United States Patent
Yang et al.

(10) Patent No.: US 12,421,117 B2
(45) Date of Patent: Sep. 23, 2025

(54) METHOD FOR SYNTHESIZING CARBON QUANTUM DOTS, AND METHOD FOR MANUFACTURING UV LIGHT- AND BLUE LIGHT-BLOCKING FILM

(71) Applicant: PUKYONG NATIONAL UNIVERSITY INDUSTRY-UNIVERSITY COOPERATION FOUNDATION, Busan (KR)

(72) Inventors: Hyun Kyoung Yang, Busan (KR); Sung Jun Park, Nam-Gu (KR)

(73) Assignee: PUKYONG NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 799 days.

(21) Appl. No.: 17/596,179

(22) PCT Filed: Jun. 3, 2020

(86) PCT No.: PCT/KR2020/007180
§ 371 (c)(1),
(2) Date: Dec. 3, 2021

(87) PCT Pub. No.: WO2020/246784
PCT Pub. Date: Dec. 10, 2020

(65) Prior Publication Data
US 2022/0234894 A1    Jul. 28, 2022

(30) Foreign Application Priority Data
Jun. 4, 2019  (KR) .................. 10-2019-0066185

(51) Int. Cl.
| | | |
|---|---|---|
| C01B 32/15 | (2017.01) | |
| C08J 5/18 | (2006.01) | |
| C08K 3/04 | (2006.01) | |
| C09K 11/65 | (2006.01) | |
| G02B 5/20 | (2006.01) | |
| H10H 20/851 | (2025.01) | |
| B82Y 20/00 | (2011.01) | |
| B82Y 40/00 | (2011.01) | |

(52) U.S. Cl.
CPC ............ C01B 32/15 (2017.08); C08J 5/18 (2013.01); C08K 3/04 (2013.01); C09K 11/65 (2013.01); G02B 5/208 (2013.01); H10H 20/8512 (2025.01); B82Y 20/00 (2013.01); B82Y 40/00 (2013.01); C01P 2004/32 (2013.01); C01P 2004/64 (2013.01); C01P 2006/60 (2013.01); C08J 2329/04 (2013.01); G02B 2207/101 (2013.01)

(58) Field of Classification Search
CPC .......... C08J 5/18; C08J 2329/04; C08K 3/04; C09K 11/65; C01B 32/15; C01P 2004/64; B82Y 20/00; B82Y 40/00; G01B 5/208; H01L 33/502
See application file for complete search history.

(56) References Cited

FOREIGN PATENT DOCUMENTS

| | | | | |
|---|---|---|---|---|
| CN | 109777407 A | * | 5/2019 | ............ C09K 11/65 |
| JP | 2018035035 | | 3/2018 | |
| KR | 101403534 | | 6/2014 | |
| KR | 101403534 B1 | * | 6/2014 | ............ B01J 23/745 |
| KR | 20160067812 | | 6/2016 | |
| KR | 101820606 | | 1/2018 | |
| KR | 20180120334 | | 11/2018 | |
| KR | 20190041430 | | 4/2019 | |

OTHER PUBLICATIONS

EPO machine translation of KR 101403534 B1, published Jun. 3, 2014 (Year: 2014).*
Clarivate Analytics machine translation of CN 109777407 A published May 21, 2019 (Year: 2019).*
International Search Report and Written Opinion issued in Corresponding PCT Application No. PCT/KR2020/007180, dated Oct. 22, 2020 (English Translation provided).
Park et al. "Ultraviolet to blue blocking and wavelength convertible films using carbon dots for interrupting eye damage caused by general lighting" *Nano Energy* 2019, vol. 60, pp. 87-94.

* cited by examiner

*Primary Examiner* — Jane L Stanley
(74) *Attorney, Agent, or Firm* — NORTON ROSE FULBRIGHT US LLP

(57) ABSTRACT

The present invention relates to a method for synthesizing carbon quantum dots capable of effectively blocking UV light and blue light from application devices composed of white LEDs, and a method for manufacturing a UV light- and blue light-blocking film, and the method for manufacturing a UV light- and blue light-blocking film, of the present invention, comprises the steps of: hydrothermally synthesizing a liquid hydrocarbon aqueous solution in a high-pressure reactor; dispersing the synthesized product in a polymer aqueous solution; and applying a dispersion solution, and then drying same.

11 Claims, 7 Drawing Sheets

METHOD FOR SYNTHESIZING CARBON QUANTUM DOTS, AND METHOD FOR MANUFACTURING UV LIGHT- AND BLUE LIGHT-BLOCKING FILM

CROSS-REFERENCE TO RELATED APPLICATIONS

This application a national phase under 35 U.S.C. § 371 of International Application No. PCT/KR2020/007180, filed Jun. 3, 2020, which claims priority to Korean Patent Application No. 10-2019-0066185, filed Jun. 4, 2019, with the Korean Intellectual Property Office. The contents of each of the referenced applications are incorporated into the present application by reference.

FIELD OF THE INVENTION

The present disclosure relates to a method for synthesizing carbon quantum dots and a method for preparing a UV-light and blue light blocking film. More specifically, the present disclosure relates to a method for synthesizing carbon quantum dots that may effectively block UV-light and blue light from application devices composed of a white LED, and a method for preparing a UV-light and blue light blocking film.

DESCRIPTION OF RELATED ART

Existing commercialized white LEDs are being applied to various devices such as lighting, computers, mobile phones, automobiles, TVs, and electric signs, and thus are directly or indirectly exposed to people's eyes. Light from the white LED has a higher percentage of a blue region (about 450 nm) that adversely affect human eyes (optic nerve damage, photoreceptor destruction, eye fatigue, cataract, glaucoma, macular degeneration, corneal inflammation, etc.).

To solve this problem, there are proposed films and dichroic filters for blocking UV-light and blue light. Commercially available blocking films absorb a specific wavelength (blue region: about 450 nm) and store the absorbed light therein to block the light of the blue region. In this case, efficiency of light emitted from the white LED is reduced due to transmittance of the blocking film.

Further, the dichroic filter uses a principle of reflecting and blocking light of a specific unwanted wavelength. However, the filter is very sensitive to an angle of incidence of the light. Thus, when light enters a path other than a specified angle of incidence, the filter cannot block light of a specific wavelength.

SUMMARY OF THE INVENTION

One purpose of the present disclosure is to provide a method for synthesizing carbon quantum dots that may effectively block UV-light and blue light, and to provide carbon quantum dots synthesized using the method.

Another purpose of the present disclosure is to provide a method for preparing a UV-light and blue light blocking film that may effectively block UV-light and blue light, and to provide a UV-light and blue light blocking film prepared using the method.

A first aspect of the present disclosure provides a method for synthesizing carbon quantum dots, the method including performing hydrothermally-synthesizing on a liquid hydrocarbon aqueous solution in a high-pressure reactor.

In one implementation of the first aspect, the liquid hydrocarbon includes at least one selected from a group consisting of acetone, benzene, ethylbenzene, toluene, ethanol, methanol, propanol, isopropyl alcohol, isopropyl ether, ethyl acetate, butanol, heptane, nonane, decane, undecane, dodecane, octane, pentanol, cyclopentane, cyclohexane, hexane, phenol, pyrrole, oleic acid, acetic acid, xylene, styrene, dimethylformamide, dimethyl sulfur monoxide, pyridine, diethyl ether, tetrahydrofuran, formamide, benzonitrile, triethylamine, tetralin, benzyl alcohol, butyl acetate, anisole, benzonitrile, trichloroethylene, and dibutyl ether.

In one implementation of the first aspect, the hydrothermally-synthesizing is performed at a temperature of 100° C. to 200° C., and is performed until the carbon quantum dots are synthesized.

In one implementation of the first aspect, the liquid hydrocarbon is acetone, wherein the hydrothermally-synthesizing is performed until the carbon quantum dots are synthesized at a temperature of 100° C. to 200° C.

In one implementation of the first aspect, the method further includes filtering a product synthesized in the hydrothermally-synthesizing.

A second aspect of the present disclosure provides a carbon quantum dot synthesized using the method as defined above, wherein the carbon quantum dot has at least one surface functional group selected from a group consisting of a hydroxyl group, an ester group, a carbonyl group, and an acid on a surface thereof. In one implementation of the second aspect, the carbon quantum dot has a spherical shape having a diameter of 2.5 nm to 9 nm.

In one implementation of the second aspect, the carbon quantum dot absorbs light in an ultraviolet region of 320 nm or lower, and has at least one light absorption peak in a wavelength range of 230 to 250 nm, and has at least one light absorption peak in a wavelength range of 280 to 320 nm.

A third aspect of the present disclosure provides a method for preparing a UV-light and blue light blocking film, the method including: performing hydrothermally-synthesizing on a liquid hydrocarbon aqueous solution in a high-pressure reactor; dispersing a product synthesized in the hydrothermally-synthesizing in a polymer aqueous solution to produce a dispersed solution, wherein the product includes carbon quantum dots; and applying and drying the dispersed solution.

In one implementation of the third aspect, the liquid hydrocarbon includes at least one selected from a group consisting of acetone, benzene, ethylbenzene, toluene, ethanol, methanol, propanol, isopropyl alcohol, isopropyl ether, ethyl acetate, butanol, heptane, nonane, decane, undecane, dodecane, octane, pentanol, cyclopentane, cyclohexane, hexane, phenol, pyrrole, oleic acid, acetic acid, xylene, styrene, dimethylformamide, dimethyl sulfur monoxide, pyridine, diethyl ether, tetrahydrofuran, formamide, benzonitrile, triethylamine, tetralin, benzyl alcohol, butyl acetate, anisole, benzonitrile, trichloroethylene, and dibutyl ether. In one implementation of the third aspect, the polymer aqueous solution includes at least one selected from a group consisting of polyvinyl alcohol (PVA), ethylene vinyl alcohol copolymer (EVOH), polyacrylate, polylactic acid (PLA), polyglycolic acid (PGA), polycaprolactone (PCL), polyhydroxybutyrate (PHB), polymethyl methacrylate, polyvinylpyrrolidone, polyethylene glycol, polydimethylsiloxane, polyacrylic acid, polystyrene, and polyethylene glycol.

In one implementation of the third aspect, the hydrothermally-synthesizing is performed at a temperature of 100° C. to 200° C., and is performed until the carbon quantum dots are synthesized.

In one implementation of the third aspect, the dispersing includes adding 10 to 40 wt % of the carbon quantum dots based on a total weight of the polymer aqueous solution into the polymer aqueous solution.

In one implementation of the third aspect, the method further includes filtering the product synthesized in the hydrothermally-synthesizing. In one implementation of the third aspect, the drying is performed at a temperature of 80 to 100° C.

In one implementation of the third aspect, the liquid hydrocarbon is acetone, wherein the hydrothermally-synthesizing is performed at a temperature of 100° C. to 200° C. until the carbon quantum dots are synthesized, wherein the dispersing includes adding 10 to 40 wt % of the carbon quantum dots based on a total weight of the polymer aqueous solution into the polymer aqueous solution.

A fourth aspect of the present disclosure provides an UV-light and blue light blocking film prepared using the method as defined above, wherein the film has an UV-light blocking percentage of 50% or greater, and a blue light blocking percentage of 25% or greater. In one implementation of the fourth aspect, the film has light-transmittance of 70% or greater in a visible light region of 500 nm or greater.

In one implementation of the fourth aspect, the film absorbs light in an ultraviolet region of 320 nm or lower, and has at least one light absorption peak in a wavelength region of 230 to 250 nm, and has at least one light absorption peak in a wavelength region of 280 to 320 nm.

In one implementation of the fourth aspect, a thickness of the film is smaller than or equal to 15 μm.

According to the present disclosure, the method may perform hydrothermally-synthesizing on the liquid hydrocarbon aqueous solution at a temperature of 200° C. or lower and thus may prepare the carbon quantum dots more efficiently than a conventional method may. The prepared carbon quantum dots may absorb the UV-light and blue light, and may convert a portion of the blue light into green light, thereby effectively blocking UV-light and blue light that adversely affects human eyes.

In particular, the carbon quantum dots according to the present disclosure have one or more light absorption peaks in a wavelength region of particularly 230 to 250 nm, and one or more light absorption peaks in a wavelength region of particularly 280 to 320 nm, and thus have high light absorbance in the ultraviolet region of 320 nm or lower. In particular, the carbon quantum dots according to the present disclosure effectively absorb and effectively block UV-B light having a wavelength range of 280 to 315 nm which is harmful to skin tissue.

Further, the film including the carbon quantum dots as prepared according to the present disclosure may not only effectively block UV-light and blue light, but also exhibit more than 70% transparency in the visible light region (>500 nm), and thus may provide bright light while blocking the UV-light or blue light from the existing commercialized white LED.

DETAILED DESCRIPTION OF THE INVENTION

Figure 1:
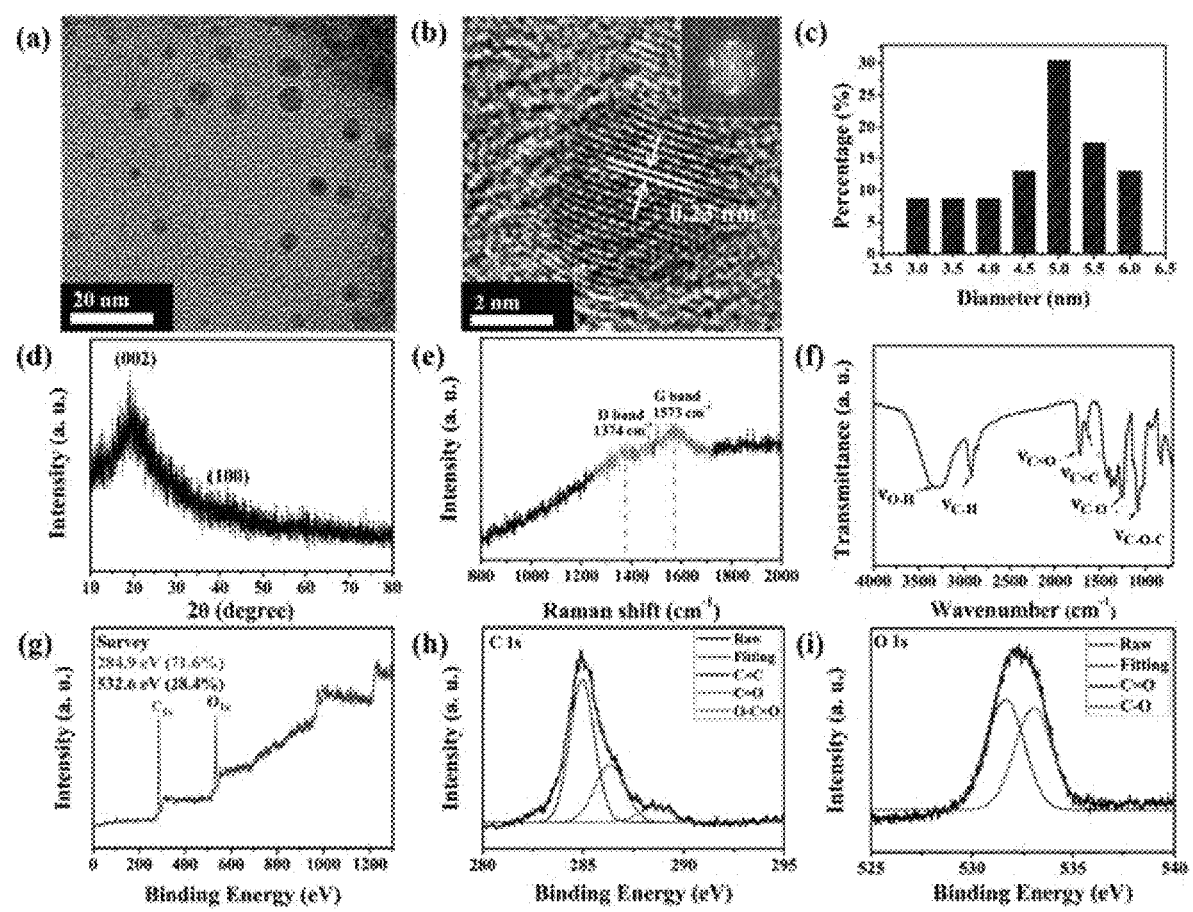
FIG. 1(a) to (c) are views sequentially showing a TEM image, an FE-TEM image, and a size distribution of carbon quantum dots synthesized according to an embodiment of the present disclosure.
FIG. 1(d) to (i) are views showing a XRD pattern, a Raman spectrum, a FT-IR spectrum, an XPS irradiation spectrum, and a XPS precise irradiation spectrum of carbon quantum dots synthesized according to an embodiment of the present disclosure, respectively.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method for synthesizing carbon quantum dots according to the present disclosure includes performing hydrothermally-synthesizing on a liquid hydrocarbon aqueous solution in a high-pressure reactor.

In this connection, the liquid hydrocarbon may be a low-molecular-weight liquid hydrocarbon with no oxygen or one or more oxygen. The liquid hydrocarbon may include any one or more selected from acetone, benzene, ethylbenzene, toluene, ethanol, methanol, propanol, isopropyl alcohol, isopropyl ether, ethyl acetate, butanol, heptane, nonane, decane, undecane, dodecane, octane, pentanol, cyclopentane, cyclohexane, hexane, phenol, pyrrole, oleic acid, acetic acid, xylene, styrene, dimethylformamide, dimethyl sulfur monoxide, pyridine, diethyl ether, tetrahydrofuran, formamide, benzonitrile, triethylamine, tetralin, benzyl alcohol, butyl acetate, anisole, benzonitrile, trichloroethylene, and dibutyl ether. The liquid hydrocarbon may be most preferably acetone. However, the disclosure is not limited thereto.

Further, the hydrothermally-synthesizing is preferably performed in the high-pressure reactor at a temperature of 100° C. to 200° C. until the carbon quantum dots are synthesized.

When the temperature in the hydrothermally-synthesizing is lower than 100° C., sufficient heat is not applied thereto, so that the carbon quantum dots are not synthesized. When the heating temperature exceeds 200° C., a light absorption peak does not appear in the wavelength region of 280 to 320 nm, such that absorbance of UV-light lower than 320 nm, especially, absorbance of UV-B light having a wavelength range of 280 to 315 nm is lowered, and blue light is partially absorbed, thereby making it difficult to effectively block the UV-light and blue light.

Therefore, the hydrothermally-synthesizing is most preferably performed for about 8 to 12 hours until the carbon quantum dots are synthesized at a temperature of 100° C. to 200° C.

In one example, the method according to the present disclosure may further include filtering a product synthesized in the hydrothermally-synthesizing.

The synthesized product contains carbon quantum dots, and organic substances such as aromatic oil, and sediment. For example, the synthesized product is purified using a membrane filter to first remove a large product therefrom. Then, the filtrate is dialyzed for 12 hours using a 1000 Da dialysis membrane. Again, final filtration is performed using a membrane filter to obtain synthesized carbon quantum dots.

However, the present disclosure is not limited to the above example. The method may filter the synthesized product using other filtration means.

Another embodiment of the present disclosure may provide carbon quantum dots synthesized using the method for synthesizing the carbon quantum dots as described above.

The carbon quantum dot may include one or more surface functional groups selected from a hydroxyl group, an ester group, a carbonyl group, and an acid, and may have a spherical shape having a diameter of 2.5 to 9 nm.

The carbon quantum dots may absorb light in the ultraviolet region of 320 nm or lower, and have one or more light absorption peaks in the wavelength region of 230 to 250 nm, and have one or more light absorption peaks in the wavelength region of 280 to 320 nm.

That is, the carbon quantum dots may have two or more light absorption peaks in the ultraviolet region of 320 nm or lower, and thus have high light absorbance in the ultraviolet region of 320 nm or lower. Therefore, the carbon quantum dots may effectively absorb and effectively block the UV-B light having a wavelength range of 280 to 315 nm which is harmful to skin tissue.

Further, the carbon quantum dots may absorb blue light and UV-light and convert a portion of the blue light into green light to effectively block the UV-light and blue light that adversely affect human eyes.

In one example, another embodiment of the present disclosure may provide a method for preparing a UV-light and blue light blocking film. The method for preparing the UV-light and blue light blocking film includes performing hydrothermally-synthesizing on a liquid hydrocarbon aqueous solution in a high-pressure reactor, dispersing a synthesized product in a polymer aqueous solution, and applying the dispersed solution and drying the same.

First, a step of performing the hydrothermally-synthesizing on the liquid hydrocarbon aqueous solution in a high-pressure reactor is performed.

In this connection, the liquid hydrocarbon may be a low-molecular-weight liquid hydrocarbon with no oxygen or one or more oxygen. The liquid hydrocarbon may include any one or more selected from acetone, benzene, ethylbenzene, toluene, ethanol, methanol, propanol, isopropyl alcohol, isopropyl ether, ethyl acetate, butanol, heptane, nonane, decane, undecane, dodecane, octane, pentanol, cyclopentane, cyclohexane, hexane, phenol, pyrrole, oleic acid, acetic acid, xylene, styrene, dimethylformamide, dimethyl sulfur monoxide, pyridine, diethyl ether, tetrahydrofuran, formamide, benzonitrile, triethylamine, tetralin, benzyl alcohol, butyl acetate, anisole, benzonitrile, trichloroethylene, and dibutyl ether. The liquid hydrocarbon may be most preferably acetone. However, the disclosure is not limited thereto.

Further, the hydrothermally-synthesizing is preferably performed in the high-pressure reactor at a temperature of 100° C. to 200° C. until the carbon quantum dots are synthesized.

When the temperature in the hydrothermally-synthesizing is lower than 100° C., sufficient heat is not applied thereto, so that the carbon quantum dots are not synthesized. When the heating temperature exceeds 200° C., a light absorption peak does not appear in the wavelength region of 280 to 320 nm, such that absorbance of UV-light lower than 320 nm, especially, absorbance of UV-B light having a wavelength range of 280 to 315 nm is lowered, and blue light is partially absorbed, thereby making it difficult to effectively block the UV-light and blue light.

Therefore, the hydrothermally-synthesizing step is most preferably performed for about 8 to 12 hours until carbon quantum dots are synthesized at a temperature of 100° C. to 200° C.

Further, the method according to the present disclosure may further include a step of filtering the product synthesized in the step of hydrothermally-synthesizing. This step may be performed in the same manner as that in the method for synthesizing the carbon quantum dots as described above. Thus, the descriptions thereof will be omitted.

Then, the step of dispersing the synthesized product in the polymer aqueous solution proceeds.

Specifically, it is preferable to use carbon quantum dots as the synthesized product. The polymer aqueous solution may include at least one selected from polyvinyl alcohol (PVA), ethylene vinyl alcohol copolymer (EVOH), polyacrylate, polylactic acid (PLA), polyglycolic acid (PGA), polycaprolactone (PCL), polyhydroxybutyrate (PHB), polymethyl methacrylate, polyvinylpyrrolidone, polyethylene glycol, polydimethylsiloxane, polyacrylic acid, polystyrene, polyethylene glycol. However, the disclosure is not limited thereto.

Further, in the dispersing step, it is preferable to add 10 to 40 wt % of the carbon quantum dots based on a total weight of the polymer aqueous solution to the polymer aqueous solution. When the content of the carbon quantum dots is smaller than 10 wt %, the content of carbon quantum dots is insignificant such that the UV-light and blue light blocking effect is insignificant. When the content thereof exceeds 40 wt %, transparency of the prepared film is significantly lowered.

After completing the dispersing step, the method may include applying the dispersed solution and drying the same. In this connection, the drying step is preferably performed at a temperature of 80 to 100° C. for at least one day. Thus, a film having excellent UV-light and blue light blocking efficiency and containing carbon quantum dots may be prepared.

The film prepared through the above method exhibits a UV-light blocking percentage of 50% or higher, a blue light blocking percentage of 25% or higher, and a light-transmittance of 70% or higher in a visible light region of 500 nm or larger.

Further, the film may absorb light in an ultraviolet region of 320 nm or lower, and may have one or more light absorption peaks in a wavelength region of 230 to 250 nm, and may have one or more light absorption peaks in a wavelength region of 280 to 320 nm.

Therefore, the film prepared according to the present disclosure may have two or more light absorption peaks in the ultraviolet region of 320 nm or lower, and thus may have high light absorbance in the ultraviolet region of 320 nm or lower, and therefore, may effectively absorb and block the UV-B light having a wavelength range of 280 to 315 nm which is harmful to skin tissue.

Further, the film according to the present disclosure may not only block the UV-light and blue light, but also exhibit greater than 70% transparency in the visible region (>500 nm), and thus may provide bright light while blocking the UV-light or blue light from the existing commercialized white LED. Thus, the film may be used as a coating film for automobiles and a glass window coating film to block the UV-B light.

In one example, a thickness of the film is preferably 15 μm or smaller.

Hereinafter, various Examples and Experimental Examples of the present disclosure will be described in detail. However, the following examples are only some implementations of the present disclosure, and the present disclosure should not be construed as being limited to the following examples.

Synthesis of Carbon Quantum Dots

Acetone (20 mL) and ultrapure water (DI water, 20 mL) were introduced into a beaker and stirred for 30 minutes using a magnetic stirrer (mixed solution 1). The mixed solution 1 was then transferred into a stainless-steel high pressure reactor having a Teflon liner (80 mL volume and 50% filler), heated to 150° C. at a rate of 2° C./min, and maintained for 10 hours under magnetic stirring at 200 rpm.

After completion of the reaction, the high pressure reactor was slowly cooled to 25° C., and the solution was filtered using a 0.2 μm membrane filter (CHM, Spain) to remove large aggregates.

Next, the synthesized product was purified using a 1000 Da dialysis membrane (molecular weight cutoff 1000 Da, Spectra/Por®6, nominal plane width 45 mm, diameter 29 mm, USA) for 24 hours. Then, filtrate was subjected to filtration using a 0.2 μm membrane filter. Thus, synthesized carbon quantum dots were obtained Structural Characteristics of Carbon Quantum Dots FIG. 1($a$) to ($c$) are views sequentially showing a TEM image, an FE-TEM image, and a size distribution of carbon quantum dots synthesized according to an embodiment of the present disclosure.

Referring to FIGS. 1($a$) and ($b$), each of the carbon quantum dots has a spherical shape. The dots have lattice spacings of 0.23 nm and 0.41 nm (not shown in the figure) corresponding to (100) and (002) peaks of graphitic carbon, respectively. Thus, it may be identified that the carbon quantum dots according to the present disclosure have high crystallinity.

Further, referring to FIG. 1($c$), diameters of the carbon quantum dots are mainly distributed in a range of about 5 nm, and each dot has a diameter in a range of 2.5 to 9 nm.

Further, the XRD pattern of the carbon quantum dots exhibits a broad peak at $2\theta=20.4°$ nm and $2\theta=41°$ nm. This is due to disordered carbon atoms with (002) and (100) planes (Refer to FIG. 1($d$)).

Further, in the Raman spectrum shown in FIG. 1($e$), two main peaks may be identified.

Specifically, a D band ($sp^3$ defect) at 1374 $cm^{-1}$ and a G band ($sp^2$ carbon) at 1374 $cm^{-1}$ appear. The D band is due to vibration of carbon atoms with dangling bonds on an end face of the disordered graphite. The G band corresponds to the $E_{2g}$ mode of graphite, and is due to the vibration of $sp^2$-bonded carbon atoms in a two-dimensional (2D) hexagonal lattice.

In general, the presence of defective carbon structures is low when the G band exhibits a higher intensity than the D band exhibits. An $I_G/I_D$ intensity ratio of the carbon quantum dots according to the present disclosure is about 1.1. This means high crystallinity of the carbon quantum dots according to the present disclosure.

FIG. (f) 1 is a graph showing a FTIR spectrum of carbon quantum dots, and the surface functional groups of carbon quantum dots may be identified with reference to FIG. 1($f$).

Specifically, as shown in FIG. 1($f$), the carbon quantum dots exhibit broad and strong peaks at 3421 $cm^{-1}$, 2981 $cm^{-1}$, 1741 $cm^{-1}$, 1633 $cm^{-1}$, 1478 $cm^{-1}$, and 1045 $cm^{-1}$ corresponding to a hydroxyl group (O—H), CH, an ester group (C=O), C=C, CO and COC, respectively. Thus, it may be identified that the carbon quantum dots according to the present disclosure include various surface functional groups such as a hydroxyl group, an ester group, a carbonyl group, and an acid.

Figure 2:
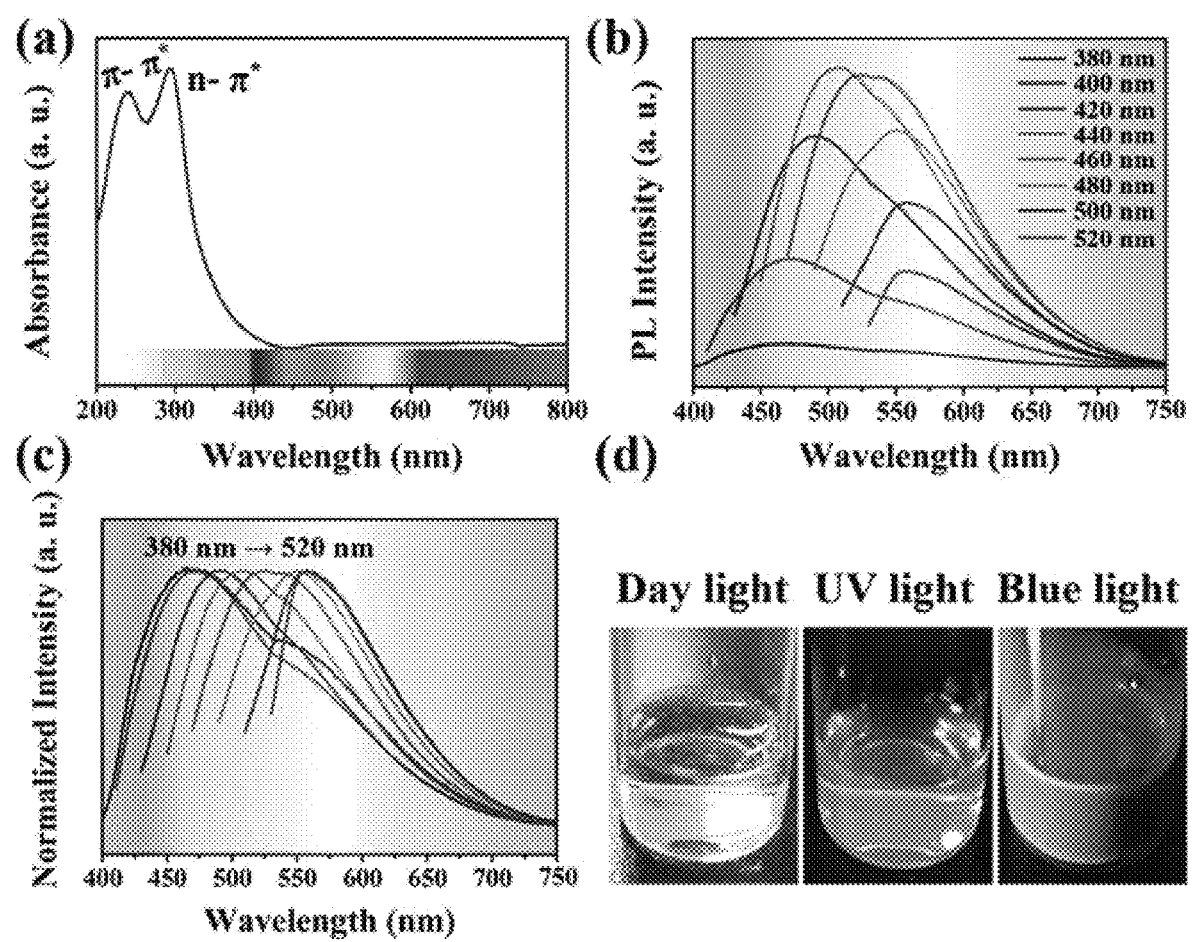
FIG. 2(a) is a graph showing a UV-VIS absorption spectrum in the ultraviolet (UV), visible and infrared (IR) regions of carbon quantum dots according to an embodiment of the present disclosure.
FIGS. 2(b) and (c) are graphs showing PL spectra of carbon quantum dots upon excitation based on a varying wavelength.
FIG. 2(d) shows an image of carbon quantum dots taken upon excitation under daylight, UV-light and blue light.

In one example, referring to FIG. 2(g) showing the XPS spectrum of carbon quantum dots, the carbon quantum dots exhibit two predominant peaks at 284.9 eV ($C_{1s}$) and 532.6 eV ($O_{1s}$), respectively, and relative contents thereof are 71.6% (C) and 28.4% (O).

Specifically, referring to FIGS. 1(h) and (i), it may be identified that $C_{1s}$ is deconvolved into three bands due to C=C($sp^2$) at 284.7 eV, C=O($sp^2$) at 286.5 eV, and O—C=O($sp^2$) at 288.2 eV, and $O_{1s}$ is deconvolved into two bands of 531.7 eV (C=O) and 532.9 eV (C—O).

Optical Properties of Carbon Quantum Dots

FIG. 2(a) is a graph showing a UV-VIS absorption spectrum in the ultraviolet (UV), visible and infrared (IR) regions of carbon quantum dots according to an embodiment of the present disclosure. FIGS. 2(b) and (c) are graphs showing PL spectra of carbon quantum dots upon excitation based on a varying wavelength.

As shown in FIG. 2(a), the absorption spectrum of carbon quantum dots exhibits two strong peaks in the UV region. Specifically, one peak is a strong peak at 242 nm due to the π-π* transition of the C=C bond, and the other peak is a strong peak at 296 nm due to the n-π* transition of the C=O bond.

That is, the carbon quantum dots according to the present disclosure are found to effectively absorb UV-light of 320 nm or lower, particularly, UV-B light having a wavelength range of 280 to 315 nm which is harmful to skin tissue.

Further, referring to FIGS. 2(b) and (c), it may be identified that when the carbon quantum dots are excited with light having whose a wavelength increases by 20 nm in a wavelength range of 380 nm to 520 nm, a corresponding emission peak is shifted toward red while being in a range from 450 nm to 560 nm. That is, the carbon quantum dots according to the present disclosure exhibits strong green fluorescence of 516 nm under excitation with light of 440 nm.

FIG. 2(d) shows an image of carbon quantum dots taken upon excitation under daylight, UV-light and blue light. As shown in FIG. 2(d), the carbon quantum dots emit bright yellow, blue and green colors under excitation using daylight, UV-light, and blue light, respectively.

Film Preparation

After introducing 1.0 g of polyvinyl alcohol (PVA, MW=1500 g/mol) powders into 20 mL of ultrapure water, the mixture was vigorously stirred at 90° C. using a magnetic stirrer until a clear solution was obtained, and then was cooled to room temperature.

Then, an appropriate amount of the PVA solution was poured into 4 beakers, and the carbon quantum dots according to the example of the present disclosure were added to the four PVA solutions in different contents (10, 20, 30 and 40 wt %), respectively. The mixture was stirred for 1 hour to prepare each of four homogeneous solutions in which the carbon quantum dots were dispersed.

Next, each homogeneous solution was applied to a Petri dish using a pipette, and dried at 90° C. for one day to prepare each high-quality transparent and flexible film including carbon quantum dots.

The four prepared films are respectively named as Present Example 1 (C-dot film (10 wt %)), Present Example 2 (C-dot film (20 wt %)), Present Example 3 (C-dot film (30 wt %)), and Present Example 4 (C-dot film (40 wt %)), depending on a content of the carbon quantum dots.

A prepared PVA film as Comparative Example was prepared in the same manner as the manner in the above example except that a PVA solution not containing the carbon quantum dots was used.

Film Properties

Figure 3:
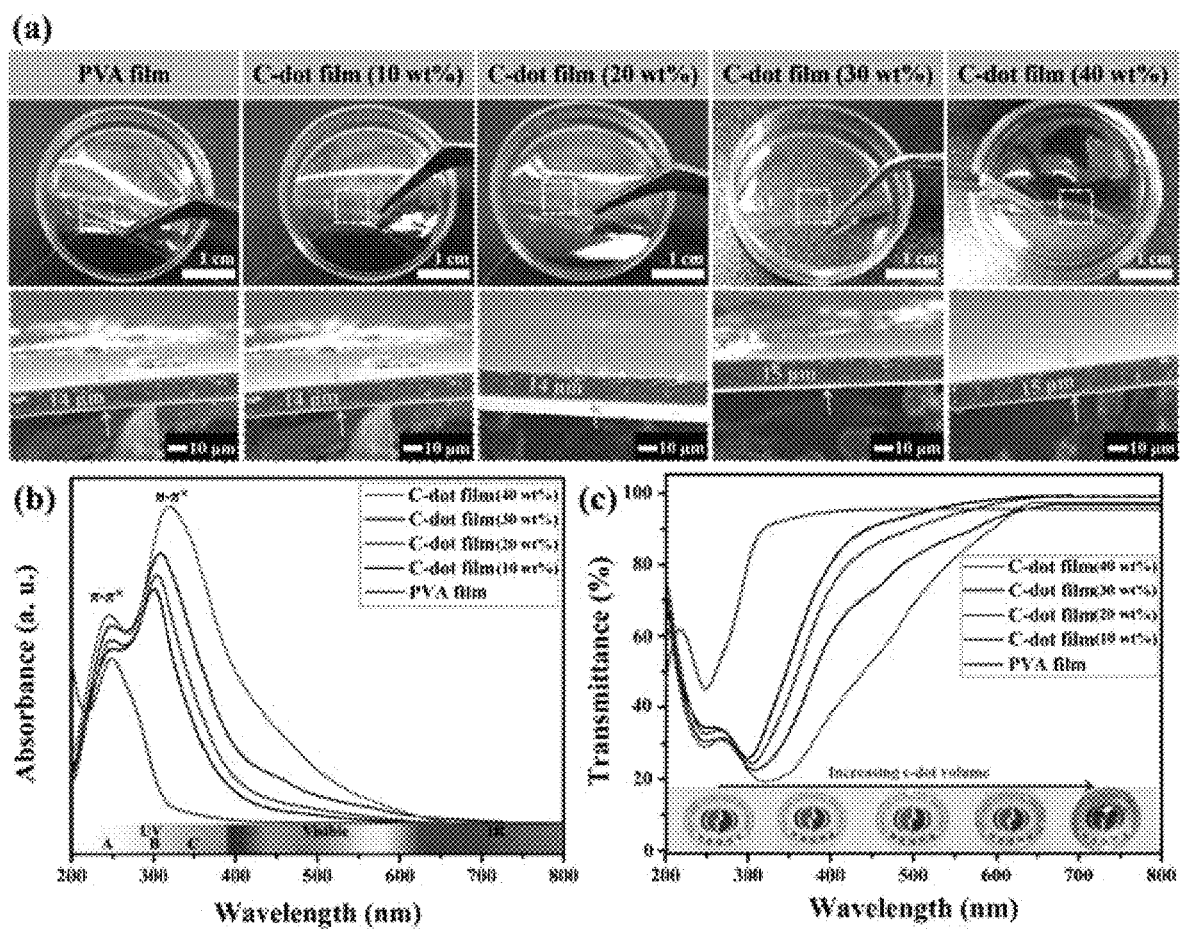
FIG. 3(a) is images showing Present Examples 1 to 4 as prepared according to the method for preparing a film according to the present disclosure and Comparative Examples.
FIG. 3(b) is a graph showing UV-VIS absorption spectra in the ultraviolet (UV), visible, and infrared (IR) regions of Comparative Examples and Present Examples 1 to 4.
FIG. 3(c) is a diagram showing transmittance spectra and images of Comparative Example and Present Examples 1 to 4.

FIG. 3(a) is images showing Present Examples 1 to 4 as prepared according to the method for preparing a film according to the present disclosure and Comparative Examples.

Referring to FIG. 3(a), it may be identified that the colors of the films become darker as the example changes from Present Example 1 (C-dot film (10 wt %)) to Present Example (C-dot film (40 wt %)). That is, it is identified that the color of the prepared film is darker as the content of carbon quantum dots contained in the film increases.

To the country, a thickness of each of the films of Present Example 1 to Present Example was measured to be in a range of about 14 to 15 μm. Thus, although the content of carbon quantum dots contained in the film increases, the thickness of the film does not change significantly.

FIG. 3(b) is a graph showing UV-VIS absorption spectra in the ultraviolet (UV), visible, and infrared (IR) regions of Comparative Examples and Present Examples 1 to 4.

Referring to FIG. 3(b), in the PVA film which is the Comparative Example, only one absorption peak is observed. An absorption peak of the Comparative Example exhibits a band centered at 260 nm.

To the contrary, in each of Present Examples 1 to 4 including the carbon quantum dots, two absorption peaks are observed. A first absorption peak in each of Present Examples 1 to 4 is centered at about 248 nm, and is due to the π-π* transition of the C=C bond. A second absorption peak thereof is centered at about 313 nm and is due to the n-π* transition of C=O.

That is, it may be identified that Present Examples 1 to 4 according to the present disclosure effectively absorb UV-light, particularly UV-B light having a wavelength range of 280 to 315 nm, which is harmful to skin tissue, compared to Comparative Example.

Further, the absorption intensity of the film gradually increases as the example changes from Present Example 1 to Present Example. This may indicate that the absorption intensity of the film increases as the content of carbon quantum dots in the film increases.

FIG. 3(c) is a diagram showing transmittance spectra and images of Comparative Example and Present Examples 1 to 4.

As shown in FIG. 3(c), the light-transmittance of the Comparative Example (PVA film) is above 90% in the visible light region.

Each of Present Examples 1 to 4 exhibits 70% or higher of light-transmittance in the visible light region except for the blue light region. Further, it is identified that light-transmittance of the film decreases as the example changes from Present Example 1 to Present Example, and light-transmittance of the film decreases as the content of the carbon quantum dots in the film increases.

That is, referring to the image of FIG. 3(c), as the content of the carbon quantum dots in the film increases, that is, the example changes from Present Example 1 to Present Example 4, the color of the film gradually changes from white to dark brown. All of films are transparent.

Blue Light Blocking Properties of Film

Experimental Example 1

Figure 4:
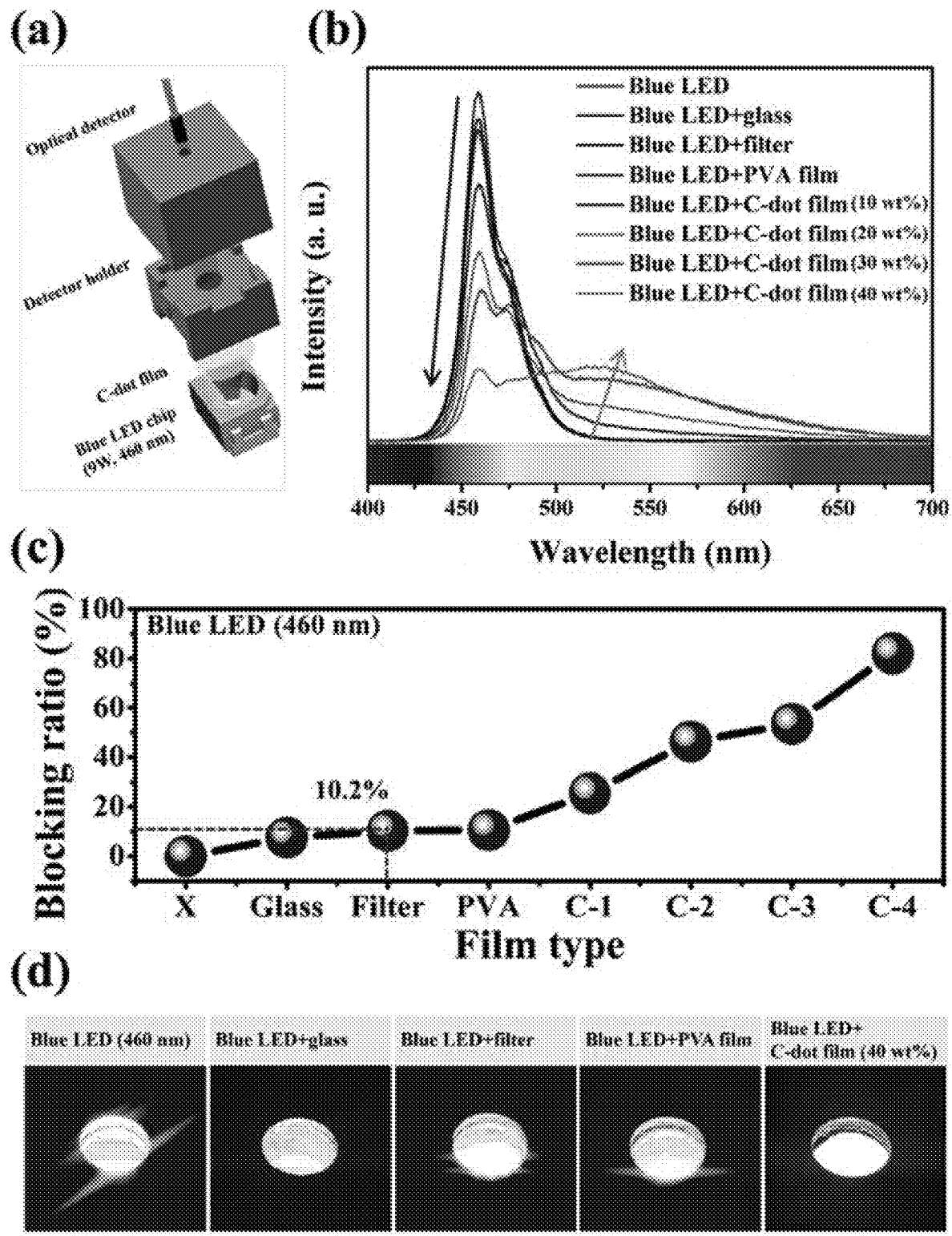
FIG. 4(a) is a diagram schematically showing blue light blocking characteristic experiment of the film according to the present disclosure. (b) in FIG. 4 is a graph showing a transmitting blue light spectrum of each Example, and (c) in FIG. 4 is a diagram showing blue light blocking percentage of each Example.
FIG. 4(d) shows images of glass, a blue light blocking filter, a PVA film, and Present Example irradiated with blue light using an InGaN LED chip (9 W, 460 nm).

To investigate the blue light blocking properties of the film, blue light from an InGaN LED chip (9 W, 460 nm) was irradiated to each of Present Examples 1 to 4, and the PVA film, glass and the blue light blocking filter (HD, CRYSTAL) as Comparative Examples (see FIG. 4(a)). Then, the transmitting blue light spectrum is shown in FIG. 4(b), and the blue light blocking percentage according to each example is shown in FIG. 4(c).

Referring to FIGS. 4(b) and (c), each of the glass, the blue light blocking filter, and the PVA film which are Comparative Examples exhibits high blue light intensity, and the blue light blocking percentage thereof is 10.2% or lower. It may be identified that each of the glass, the blue light blocking filter, and the PVA film which are Comparative Examples hardly blocks the blue light in the 460 nm region.

To the contrary, each of Present Examples 1 to 4 has the blue light blocking percentage of 25.2% or higher. In particular, the blue light blocking percentage of the film increases as the example changes from Present Example 1 to Present Example 4 (that is, from C-1 to C-4). Thus, it is believed that the higher the carbon content in the film, the higher the light blocking percentage in the 460 nm region.

Specifically, the blue light blocking percentages of the glass, the blue light blocking filter, and the PVA film are 7.4%, 10.2%, and 10.8%, respectively. The blue light blocking percentages of Present Examples 1 to 4 are as follows: Present Example 1 (25.2%), Present Example 2 (46.5%), Present Example 3 (53.8%) and Present Example 4 (82.3%). This means that the blue light blocking percentages of Present Examples 1 to 4 according to the present disclosure are 2.47 times, 4.56 times, 5.27 times, and 8.07 times higher, respectively, compared to that of the PVA film.

In one example, the intensity of green light in each of Present Examples 1 to 4 increases as the example changes from Present Example 1 to Present Example. Thus, it may be identified that the intensity of green light through the film increases as the content of carbon quantum dots in the film increases.

FIG. 4(d) shows images of glass, a blue light blocking filter, a PVA film, and Present Example irradiated with blue light using an InGaN LED chip (9 W, 460 nm).

Referring to FIG. 4(d), it may be identified that when light passes through the glass, the blue light blocking filter, and the PVA film, which are Comparative Examples, the intensity of blue light hardly changes. To the contrary, it may be identified that when light from the LED chip passes through the Present Examples, the blue light intensity of the light is significantly weaker than that in the Comparative Examples.

Experimental Example 2

Figure 5:
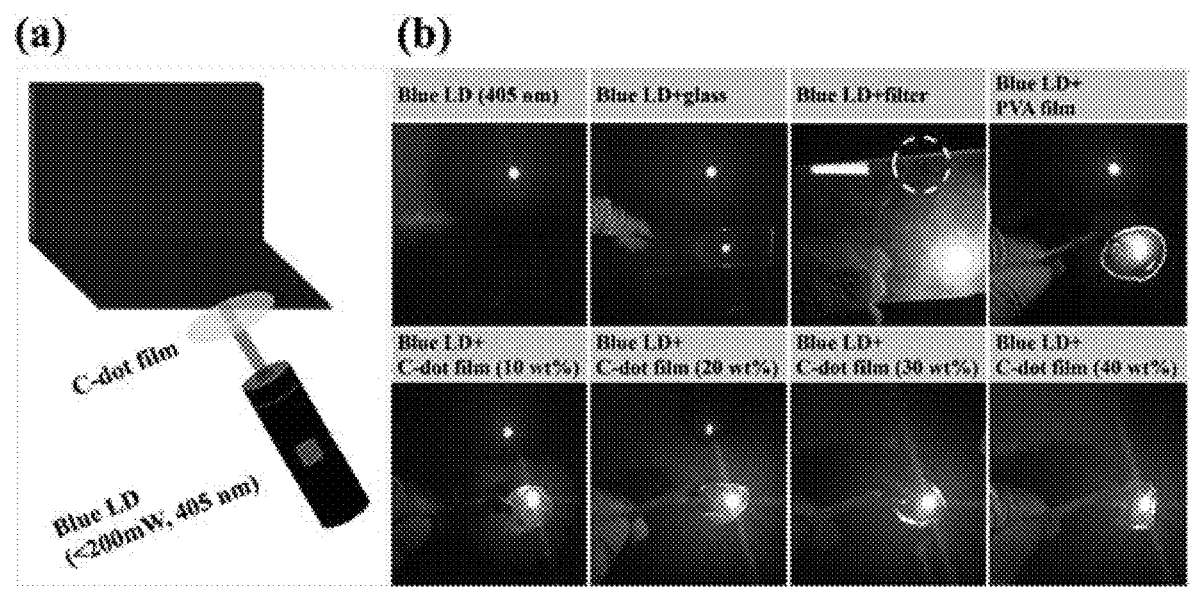
FIG. 5(a) is a diagram schematically showing a blue light blocking characteristic experiment of the film according to the present disclosure. (b) in FIG. 5 is a view showing images of glass, a blue light blocking filter, a PVA film, and Present Examples 1 to 4 excited using a blue laser diode.

To investigate the blue light blocking properties of the film, blue light from a blue laser diode (LD<200 mW, 405 nm) was irradiated to Present Examples 1 to 4 and Comparative Examples, that is, the PVA film, the glass and the blue light blocking filter (HD, CRYSTAL) (see FIG. 5(a)). Images of the glass, the blue light blocking filter, the PVA film and Present Example 1 as excited using the light from the blue laser diode are shown in FIG. 5(b).

The intensity of blue light transmitting through each of the glass and the PVA films as the Comparative Examples are similar to that of the blue light from the blue laser diode. However, the intensity of blue light transmitting through the blue light blocking filter are very weak because most of the blue light is blocked with the filter.

The intensity of blue light transmitting through each of Present Examples 1 to 4 gradually decreases as the content of carbon quantum dots in the film increases. It may be identified with the naked eye that the blue light is converted into light of a long wavelength while the light passes through the film of each of Present Examples 1 to 4.

In particular, when the content of the carbon quantum dots in the film is higher than or equal to 30 wt %, an amount of the blue light which has passed through the film is significantly reduced. It may be identified that the film containing the carbon quantum dots in the content of 40 wt % (Present Example) may completely block the blue light.

UV-Light Blocking Properties of Film

Figure 6:
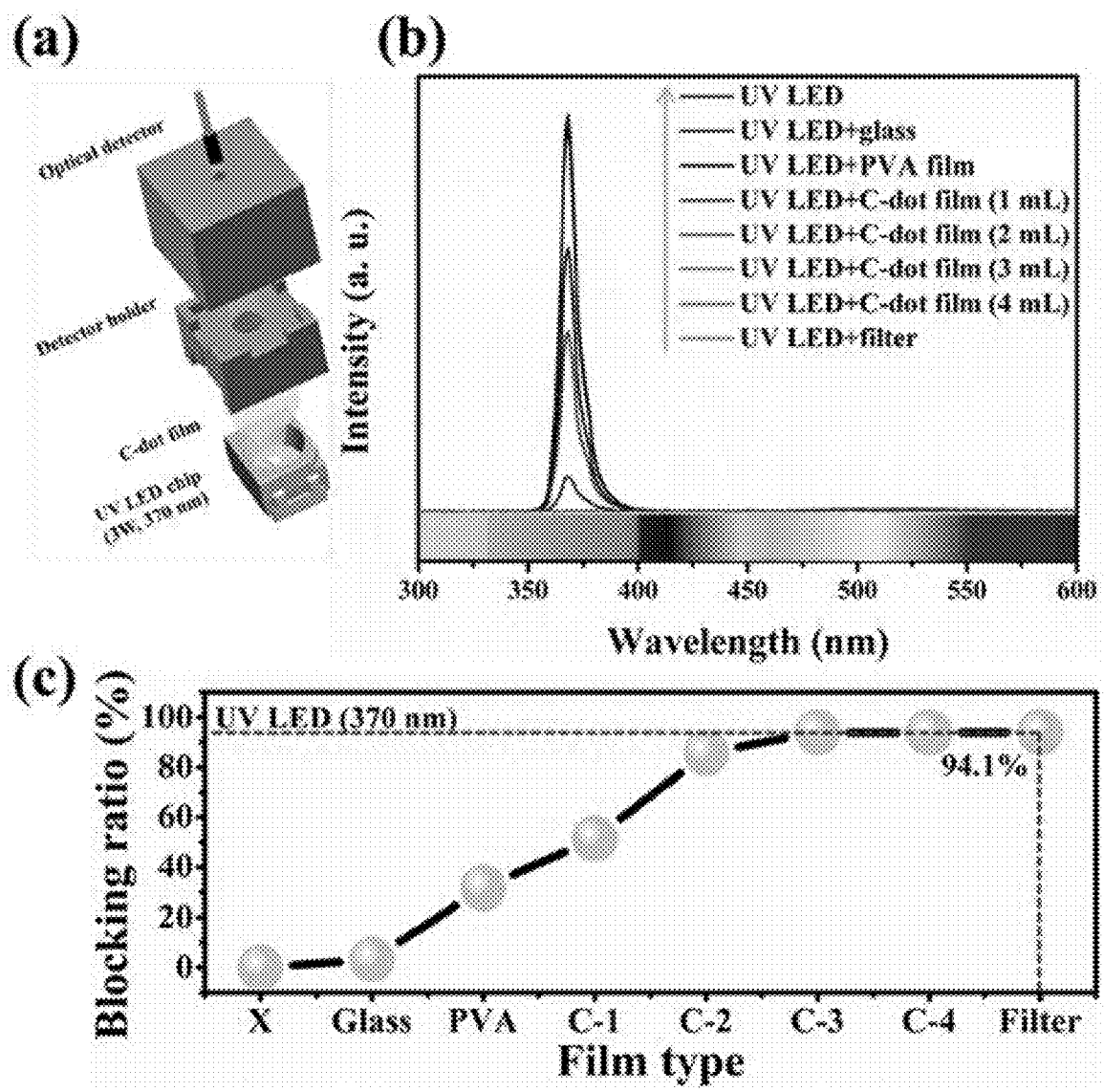
FIG. 6(a) is a diagram schematically showing a UV-light blocking characteristic experiment of the film according to the present disclosure. (b) in FIG. 6 is a graph showing a transmitted UV-light spectrum of each Example, and (c) in FIG. 6 is a diagram showing a UV-light blocking percentage of each Example.

To investigate the UV-light blocking properties of the film, an experiment was performed in the same manner as in Experimental Example 1 except that a UV LED chip (3 W, 370 nm) was used instead of an InGaN LED chip (9 W, 460 nm) (see FIG. 6(a)). Then, the transmitting UV-light spectrum is shown in FIG. 6(b), and the UV-light blocking percentage according to each Example is shown in FIG. 6(c).

Referring to FIGS. 6(b) and (c), it may be identified that each of the glass and the PVA film which are Comparative Examples hardly blocks UV-light in the 370 nm region.

To the contrary, it is identified that each of Present Examples 1 to 4 has the UV-light blocking percentage of 51.4% or higher. In particular, the UV-light blocking percentage of the film increases as the examples changes from Present Example 1 to Present Example 4 (that if, from C-1 to C-4). Thus, it is believed that the higher the carbon content in the film, the higher the light blocking percentage of the film in the 370 nm region.

Specifically, the UV-light blocking percentages of the glass and the PVA film are 3.6% and 31.7%, respectively. The UV-light blocking percentages of Present Examples 1 to 4 are as follows: Present Example 1 (51.4%), Present Example 2 (85.8%), and Present Example 3 (93.8%) and Present Example 4 (95.9%).

In particular, each of Present Examples 3 and 4 has the UV-light blocking percentage of 90% or higher, which was almost similar to the UV-light blocking percentage of the blue light blocking filter (94.1%).

Applications of Film

Figure 7:
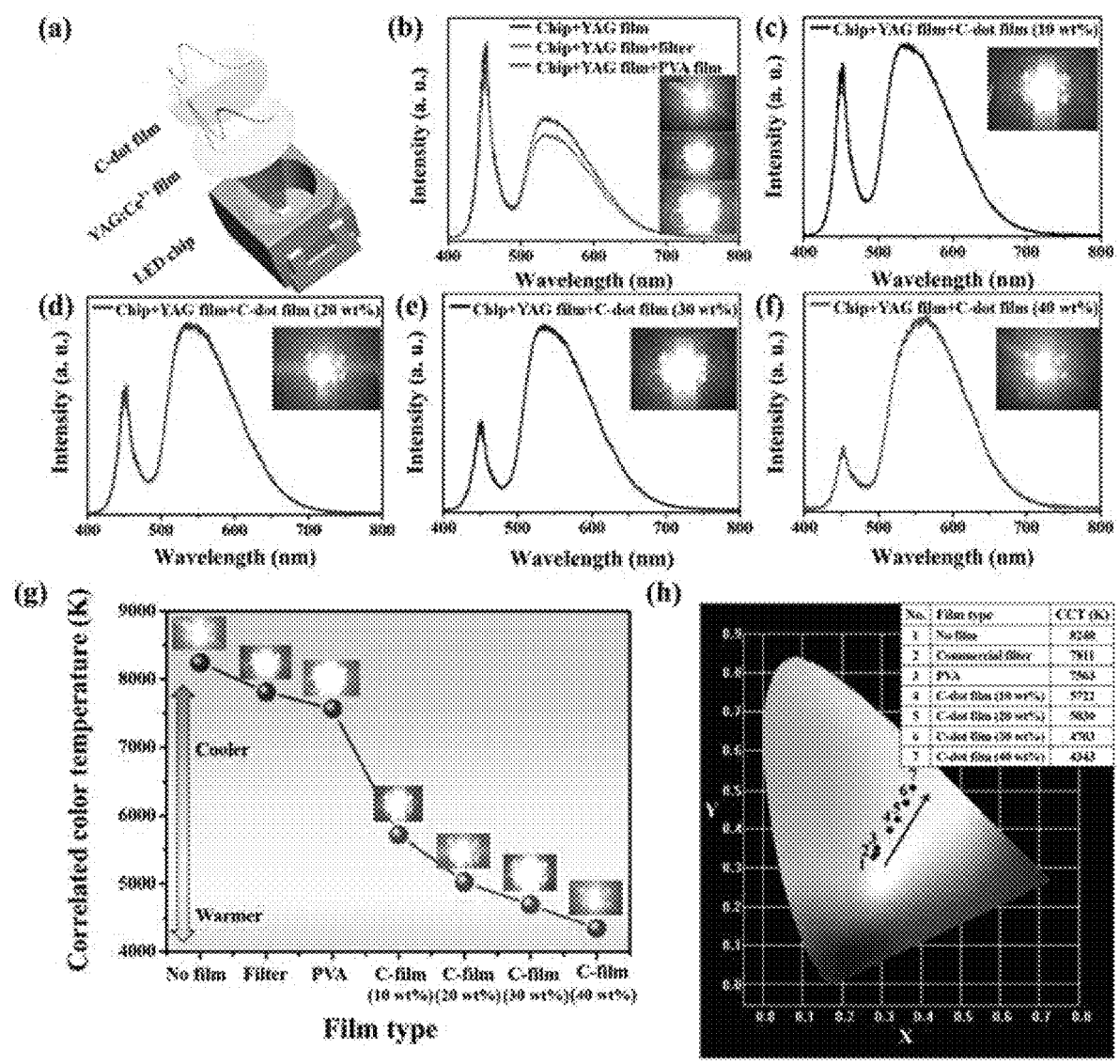
FIG. 7(a) is a diagram schematically showing a light-blocking characteristic experiment of a film using white LEDs including a blue InGaN LED chip and a YAG:$Ce^{3+}$ film.
FIG. 7(b) to (f) are graphs showing electron fluorescence spectra of LED using Present Examples 1 to 4 and Comparative Examples.
FIG. 7(g) is a graph showing correlated color temperature (CCT) values of Present Examples 1 to 4 and Comparative Examples.
FIG. 7(h) is a diagram showing CIE coordinates of LEDs using Present Examples 1 to 4 and Comparative Examples.

To identify the film application to general lighting, light from white LEDs including a blue InGaN LED chip and a YAG:$Ce^{3+}$ film was irradiated to the PVA film and the blue light blocking filter (HD, CRYSTAL) as Comparative Examples and to Present Examples 1 to 4 (see FIG. 7(a)).

FIG. 7(b) to (f) are graphs showing electron fluorescence spectra of LED using Present Examples 1 to 4 and Comparative Examples.

Referring to FIG. 7(b), when the light from the LEDs passes through each of the blue light blocking filter and the PVA film, each blue light intensity thereof is almost the same as that when each of the film and the filter is not used.

However, as shown in FIG. 7(c) to (f), it may be identified that when using each of Present Examples 1 to 4, a blue light region is reduced compared to a yellow light region as the content of carbon quantum dots in the film increases.

Thus, due to the decrease of the blue light region, the correlated color temperature (CCT) value decreases, and thus the color of the light from the LED gradually changes from a cold color to a warm color (refer to FIG. 7(g)).

However, when using each of the blue light blocking filter and the PVA film, the correlated color temperature (CCT)

value of the light from the LED hardly changes due to the low blue light blocking percentage.

FIG. 7(h) is a diagram showing CIE coordinates of LEDs using Present Examples 1 to 4 and Comparative Examples. Detailed CIE coordinates and correlated color temperatures (CCT) according to Present Examples 1 to 4 and Comparative Examples are shown in a following Table 1.

TABLE 1

|  | CIE coordinates | CCT temperature(K) |
| --- | --- | --- |
| No film | (0.284, 0.328) | 8240 |
| Blue light blocking filter | (0.290, 0.330) | 7811 |
| PVA film | (0.291, 0.341) | 7563 |
| Present Example 1 | (0.326, 0.350) | 5722 |
| Present Example 2 | (0.350, 0.419) | 5030 |
| Present Example 3 | (0.369, 0.465) | 4703 |
| Present Example 4 | (0.412, 0.492) | 4343 |

Thus, it may be identified based on these results that when applying the film including the carbon quantum dots according to the embodiment of the present disclosure to UVe or blue light-based general lighting, a region from the UV-light region to the blue light region that is harmful to the human eye may be effectively blocked with the film.

Although the above description has been set forth with reference to the preferred embodiments of the present disclosure, those skilled in the art may variously modify and change the present disclosure without departing from the spirit and scope of the present disclosure as described in the following claims.

What is claimed is:

1. A method for synthesizing carbon quantum dots, the method comprising:
    performing hydrothermal synthesis of an aqueous solution consisting of acetone as a carbon source and water in a high-pressure reactor at a temperature of 100° C. to 200° C. until carbon quantum dots are synthesized from the acetone;
    wherein acetone is the sole carbon source; and
    wherein the synthesized carbon quantum dots absorb light in an ultraviolet region below 320 nm, and have one or more light absorption peaks in a wavelength range of 230 to 250 nm, and one or more light absorption peaks in a wavelength range of 280 to 320 nm.

2. The method of claim 1, wherein the method further includes filtering a product synthesized in the hydrothermally-synthesizing.

3. The method of claim 1, wherein the hydrothermal synthesis is performed for 8 to 12 hours.

4. The carbon quantum dot synthesized using from the method according to claim 1, wherein the carbon quantum dot has at least one surface functional group selected from a group consisting of a hydroxyl group, an ester group, a carbonyl group, and an acid on a surface thereof.

5. The carbon quantum dot of claim 4, wherein the carbon quantum dot has a spherical shape having a diameter of 2.5 nm to 9 nm.

6. A method for preparing a UV-light and blue light blocking film, the method comprising:
    performing hydrothermal synthesis of an aqueous solution consisting of acetone as a carbon source and water in a high-pressure reactor at a temperature of 100° C. to 200° C. until carbon quantum dots are synthesized from the acetone;
    wherein acetone is the sole carbon source;
    dispersing a product synthesized in the hydrothermal synthesis in a polymer aqueous solution to produce a dispersed solution, wherein the product includes carbon quantum dots; and
    applying and drying the dispersed solution;
    wherein the synthesized carbon quantum dots absorb light in an ultraviolet region of below 320 nm, and have one or more light absorption peaks in a wavelength range of 230 to 250 nm, and one or more light absorption peaks in a wavelength range of 280 to 320 nm.

7. The method of claim 6, wherein the polymer aqueous solution includes at least one selected from a group consisting of polyvinyl alcohol (PVA), ethylene vinyl alcohol copolymer (EVOH), polyacrylate, polylactic acid (PLA), polyglycolic acid (PGA), polycaprolactone (PCL), polyhydroxybutyrate (PHB), polymethyl methacrylate, polyvinylpyrrolidone, polyethylene glycol, polydimethylsiloxane, polyacrylic acid, polystyrene, and polyethylene glycol.

8. The method of claim 6, wherein the dispersing includes adding 10 to 40 wt % of the carbon quantum dots based on a total weight of the polymer aqueous solution into the polymer aqueous solution.

9. The method of claim 6, wherein the method further includes filtering the product synthesized in the hydrothermal synthesis.

10. The method of claim 6, wherein the drying is performed at a temperature of 80 to 100° C.

11. The method of claim 6, wherein the hydrothermal synthesis is performed for 8 to 12 hours.

* * * * *

UNITED STATES PATENT AND TRADEMARK OFFICE
CERTIFICATE OF CORRECTION

PATENT NO. : 12,421,117 B2
APPLICATION NO. : 17/596179
DATED : September 23, 2025
INVENTOR(S) : Hyun Kyoung Yang and Sung Jun Park Page 1 of 1

It is certified that error appears in the above-identified patent and that said Letters Patent is hereby corrected as shown below:

In the Claims

In Claim 4, Column 14, Line 3, please delete "using" after --synthesized--.

Signed and Sealed this
Eleventh Day of November, 2025

John A. Squires
*Director of the United States Patent and Trademark Office*